Figure 1:
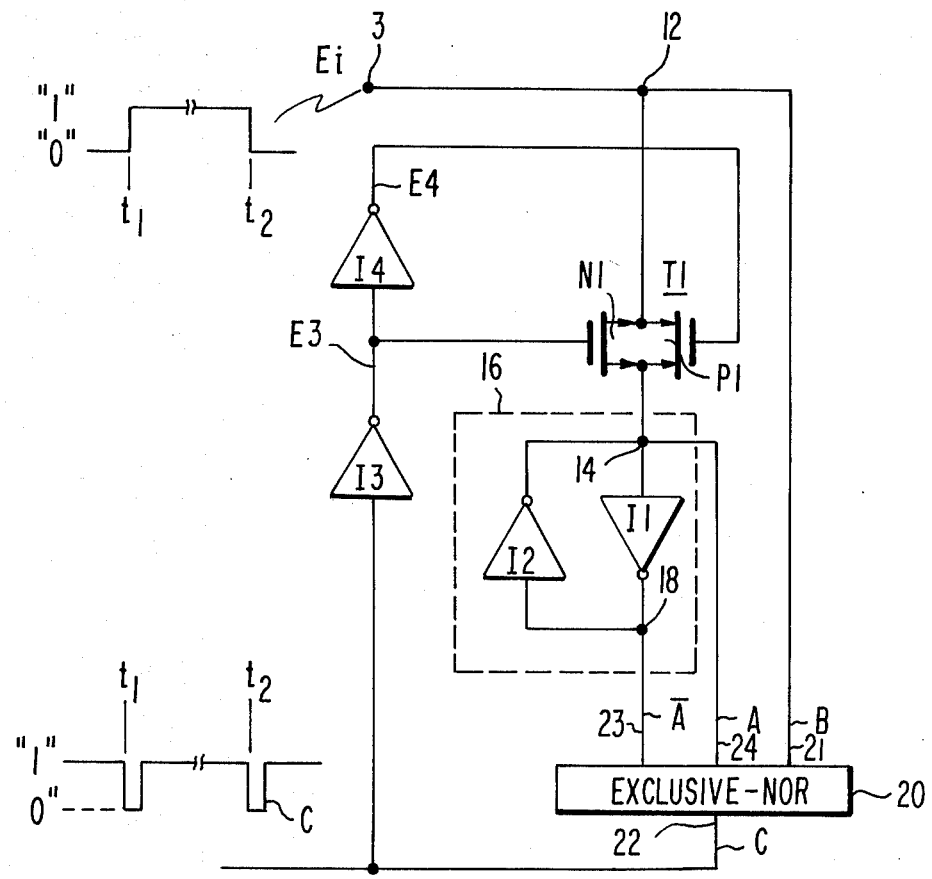

United States Patent [19]
Stewart

[11] 4,039,858
[45] Aug. 2, 1977

[54] TRANSITION DETECTOR

[75] Inventor: Roger Green Stewart, Neshanic Station, N.J.

[73] Assignee: RCA Corporation, New York, N.Y.

[21] Appl. No.: 673,866

[22] Filed: Apr. 5, 1976

[51] Int. Cl.² ........................................... H03K 5/153
[52] U.S. Cl. ..................................... 307/231; 307/353; 307/358; 328/114; 328/132
[58] Field of Search .................. 307/231, 232, 235 R, 307/235 B, 235 C, 235 E, 235 J, 216; 328/114, 119, 132

[56] References Cited
U.S. PATENT DOCUMENTS 3,958,132  5/1976  Livesay ................................ 307/231

Primary Examiner—John Zazworsky
Attorney, Agent, or Firm—H. Christoffersen; Henry I. Schanzer

[57] ABSTRACT

A circuit for detecting the transition of an input signal from one level to another includes comparator means having one input to which is applied the input signal and having another input connected to a digital storage means. The input signal is coupled to the digital storage means via a sampling gate which is controlled by means of feedback derived from the output of the comparator means. The comparator means compares the instantaneous value of the signal versus a previous value of the signal sampled via the sampling means and stored in the storage means. When the input signal changes level and assumes a new value, different from the stored value, the output of the comparator means goes from a first binary value to a second binary value enabling the sampling means and causing the new value of the input signal to be applied to and stored in the digital storage means. The output of the comparator means then returns to the first binary value disabling the sampling means.

9 Claims, 3 Drawing Figures

TRANSITION DETECTOR

This invention relates to digital means for detecting the transition of a signal from one level to another.

There are many applications where the transitions of a signal must be sensed to initiate an operation, or a series of operations. For example, in a memory array, it is desirable and/or necessary to sense changes in the address line information in order to signal the memory and associated circuitry that information is going to be written into the memory, or that information is going to be read out of the memory, and that certain housekeeping functions, such as the precharge or discharge of portions of the array, be taken care of prior to, or after, a write or a read operation. The information on the address lines is then normally decoded and determines which bit or word of the memory will have information written into or read-out from.

A known circuit for sensing a level change on an address line includes an analog delay network connected between the adress line and one input of an EXCLUSIVE - OR gate whose other input is directly connected to the address line. The problem with this circuit is that its proper operation is dependent on generating relatively large delays in the delay network. This is difficult because capacitance (or inductance) has to be added to the delay network which cannot be done easily or reliably. Another problem with this type of circuit is that its response is often not the same for rising and falling signals. In addition, the proper operation of the circuit is dependent on the rise and fall time of the address signals. If the rise and fall time of the signals are very slow a correct indication may not always be produced at the output of the EXCLUSIVE-OR gate.

It is desirable to have a transition sensing or detecting circuit which is not sensitive to the rise times and fall times of the input signals, which is reliable, requires few components, and is relatively simple.

Circuits embodying the invention include comparator means having an output at which is produced a signal having one binary value when the signals applied to its inputs are of the same binary significance (all "1" or all "0") and a signal having the other binary value when the signals applied to its inputs are of different binary significance. One of the inputs to the comparator means is coupled to a circuit input point, to which is applied a signal whose transition from one level to another level is to be detected, and another input to the comparator means is connected to a digital storage device which, in turn, is coupled via a sampling means to the circuit input point. Feedback means are connected between the output of the comparator means and the sampling means for turning it on when the signal at the output of the comparator means is at one binary value and for turning it off when the signal at the output of the comparator means is at the other binary value.

Circuits embodying the invention may also include means for applying signals to the circuit input point comprising:

a. selectively enabled transmission means for passing a signal to be detected from an input terminal to the circuit input point when enabled;

b. storage means for storing a signal transmitted by the transmission means and applying the stored signal to the circuit input point when enabled; and c. means responsive to the output of said comparator means coupled to said transmission and storage means for blocking transmission through said transmission means and enabling the storage means when the output of the comparator means is at the one binary value and for enabling transmission through the transmission means and disabling the storage means when the output of the comparator means is at the other binary value.

Figure 2:
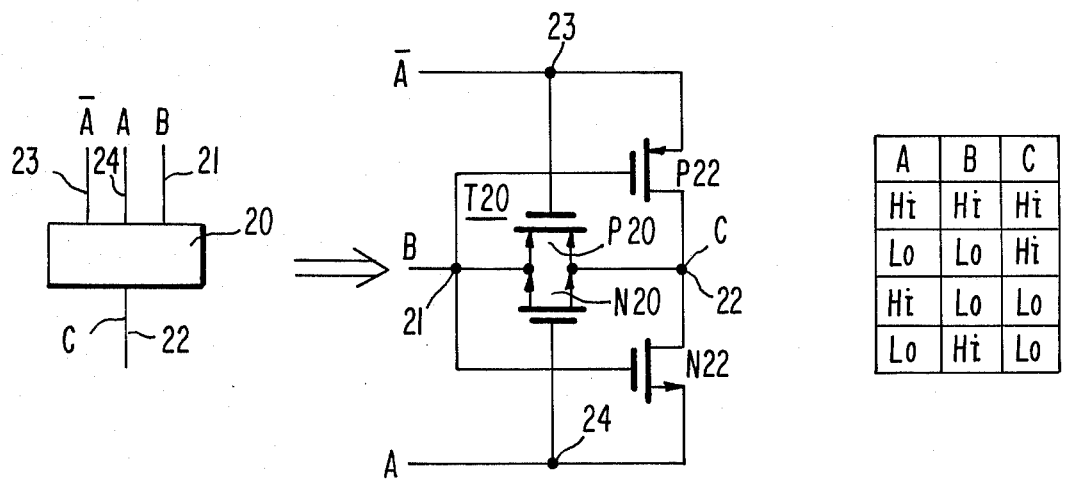
Figure 3:
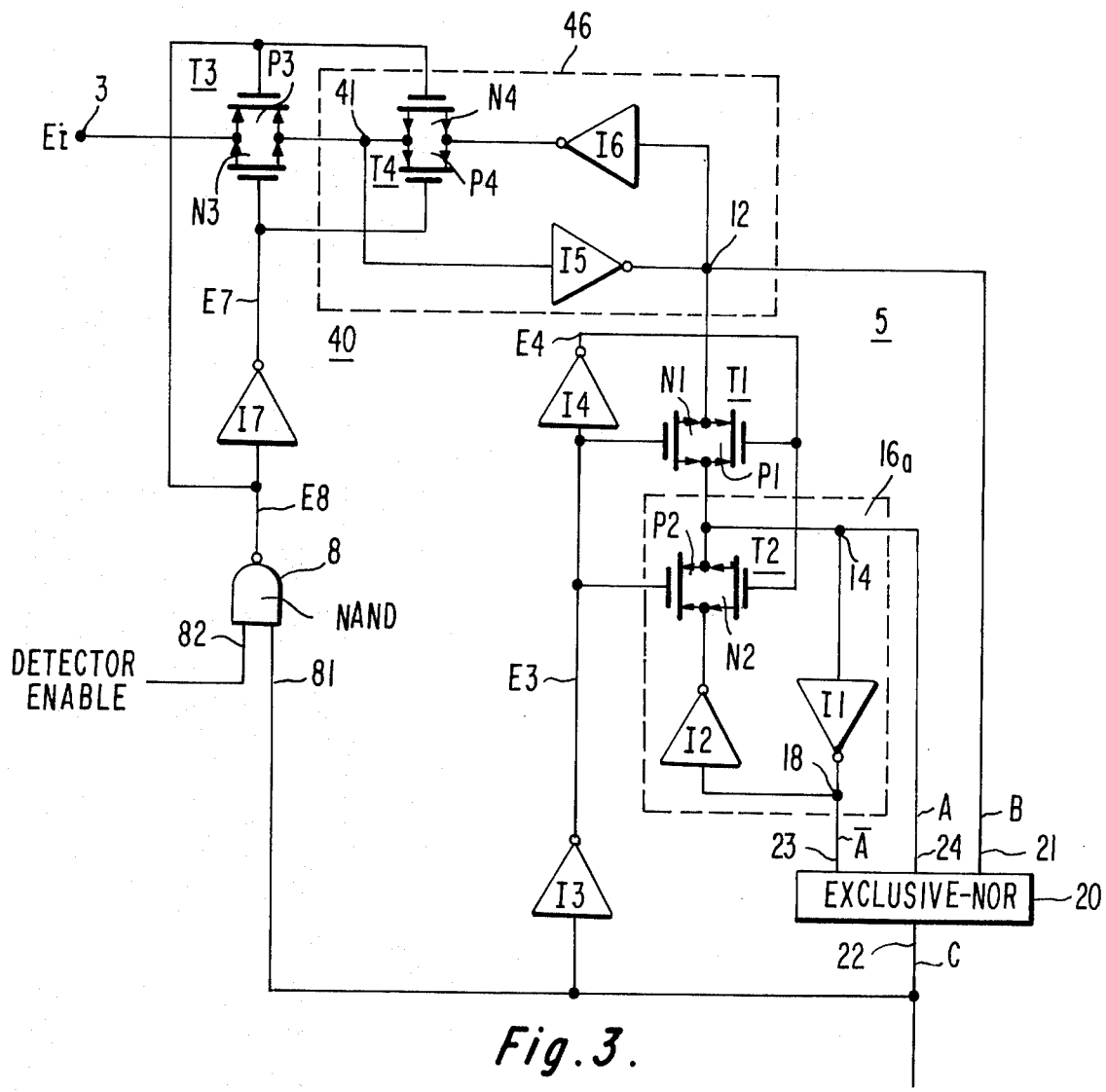

In the accompanying drawings like reference characters denote like components; and FIG. 1 is a logic diagram of a circuit embodying the invention;

FIG. 2 is a schematic diagram of an EXCLUSIVE-NOR gate useful in practicing the invention; and FIG. 3 is a logic diagram of another circuit embodying the invention.

In the discussion to follow it will be convenient to discuss operation in Boolean terms. The convention arbitrarily adopted is that the most positive voltage used in the system represents the binary digit 1 also called "high" or "hi" and the least positive voltage represents the binary digit 0 also referred to as "low" or "lo". To further simplify the explanation of the circuit operation it will sometimes be stated that a 1 (high or hi) or a 0 (low or lo) is applied to a circuit or obtained from a circuit rather than stating that a voltage which is indicative of a 1 or 0 is applied or derived from a circuit.

In the discussion to follow reference is made to inverters and transmission gates. The inverters may be of the type using complementary insulated-gate field-effect transistors (IGFETs) or any other type of device which provides the inverting function. That is, a device whose output signal is the complement of its input signal. The transmission gates illustrated in the figures are of the type using complementary conductivity type transistors. Each transmission gate is comprised of a P-conductivity type (P) IGFET and an N-conductivity type (N) IGFET having their conduction paths connected in parallel between the input and the output to the transmission gate. A gate is turned-on (enabled) when a "high" signal and a "low" signal are applied to the gate electrodes of its N and P type transistors, respectively. When enabled, the transmission gate provides a very low impedance conduction path and couples, tightly, its input to its output so that they are at approximately the same value or level. A gate is turned off (disabled) when "low" and "high" signals are applied to the gate electrodes of its N and P and transistors, respectively. When disabled the transmission gate has an extremely high impedance conduction path (virtually open circuit) and its input is disconnected or decoupled from its output. Although the transmission gates shown in the figures are of the complementary conductivity type, any transmission means which provides an equivalent function to the one described could be used instead.

In general, the circuitry shown in FIGS. 1 and 3 makes use of various combinations of logic circuits and gates to perform logic and storing functions. These gates are shown by way of example only and any logic gate which can perform the same or equivalent logic functions may be used instead.

The circuit of FIG. 1 includes an input terminal 3 to which is applied an input signal $E_i$ whose transistions from one level to another (high to low, or low to high) are to be detected. Input terminal 3 is connected to node 12 which is connected to input 21 of EXCLUSIVE-NOR (XNOR) gate 20.

A transmission gate T1 comprised of insulated-gate field-effect transistors (IGFETs) P1 and N1 having their conduction paths connected in parallel between nodes 12 and 14 passes signals between these two nodes when enabled. Transmission gate T1 is enabled when the gate electrodes of transistor N1 and P1 are driven high and low, respectively, and is disabled when the gate electrodes of transistors N1 and P1 are driven low and high respectively. When enabled or turned on transmission gate T1 functions to couple nodes 12 and 14 via its low impedance conduction path and when disabled or turned off nodes 12 and 14 are decoupled from each other since the conduction path of gate T1 appears like an extremely high impedance (open-circuit). Node 14 is connected to the input of an inverter I1 and the output of an inverter I2 (whose output impedance would normally be made high) which are cross-coupled to form a flip flop 16. The output of inverter I1 and the input of inverter I2 are connected to node 18 at which is produced a signal ($\overline{A}$) which is the complement of the signal (A) at node 14.

The signals produced at nodes 14 and 18 are referred to herein as A and $\overline{A}$, respectively. The A and $\overline{A}$ signals are aplied to inputs 24 and 23, respectively, of EXCLUSIVE NOR gate (XNOR) 20. The input signal applied to input 21 of gate 20 is referred to herein as B. Gate 20 may be any one of a number of well known circuits which produces an output having one binary value when its inputs are at the same binary level and which produces the other binary value when its inputs are at different binary levels. A logic gate having these characteristics is an EXCLUSIVE-NOR gate and a gate of this type which may be used to practice the invention is shown schematically in FIG. 2.

The circuit of FIG. 2 includes: (a) a transmission gate T20 comprised of transistors P20 and N20 having their conduction paths connected in parallel between terminal 21 and the gate 20 output terminal 22; (b) a transistor P22 having its conduction path connected between terminals 22 and 23; and (c) a transistor N22 having its conduction path connected between terminals 22 and 24. The gate electrodes of transistor P22 and N22 are connected to terminal 21 and the gate electrodes of transistors P20 and N20 are connected to terminals 23 and 24, respectively. The signal denoted B is applied to terminal 21 and the signals denoted $\overline{A}$ and A are applied to terminals 23 and 24, respectively. As shown in the truth table for FIG. 2, output C at terminal 22 is high when A and B are both "low" or both "high" and the output C is "low" when A is high and B is Lo, or A is low and B is high. Since A and $\overline{A}$ are complementary signals they are considered a single signal input to gate 20 and the input A is arbitrarily assumed to be the true input to gate 20.

Referring back to FIG. 1, the output 22 of gate 20 is connected to the input of an inverter I3 and the output of inverter I3 is connected to the gate of transistor N1 and to the input of an inverter I4. The output of inverter I4 is connected to the gate of transistor P1.

The operation of the circuit may best be explained by assuming certain steady state conditions and then the effect of a change in the value of $E_i$.

Assume initially that $E_i$(B) and A are "low" that $\overline{A}$ is "high" and that C is high. With C at the high level, the output (E3) of inverter I3 is "low" causing the output (E4) of inverter I4 to be "high". With a "low" applied to the gate electrode of transistor N1 and a high applied to the gate electrode of transistor P1, gate T1 is cut off and node 14 is decoupled from node 12.

Assume now that $E_i$ makes a transition from "low" to "high" as shown for time $t_1$. The signal A remains low and $\overline{A}$ remains high since gate T1 is cut off and the flip flop 16 is isolated from node 12. However, the input signal B applied to input 21 is now high and hence is no longer equal to, or the same value as, the signal A applied to input 24 of gate 20. Consequently, the output C goes from "high" to "low" which causes E3 to go high and E4 to go low. E3 high and E4 low causes the turn on (enables) gate T1 and initiates a sampling interval. The information (high) at node 12 is now coupled via the low impedance conduction path of gate T1 to node 14, overcoming the effect of inverter I2 and forcing the signal A at node 14 to go high and the signal $\overline{A}$ at node 18 to go low. For this new signal condition A=B=high and $\overline{A}$=Lo the output C returns to the high state causing E3 to go low and E4 to go high which causes gate T1 to be cut off. This terminates the sampling interval and node 12 is again decoupled from the input 14 of the flip flop 16 which now stores a "1".

The circuit is now ready to detect the next transition of the input signal, i.e. a change from high (logic "1") to low (logic "0") as shown for time $t_2$. When that occurs, B goes from high-to-low but A remains temporarily high due to the storage in flip flop 16. The output C goes low causing the turn on of gate T1. With T1 on, the "low" input signal is coupled to flip flop 16 causing the signal A at input 14 to go low. Since A=B=low and $\overline{A}$= high the output C returns to the high level terminating the negative excursion of the signal C at node 22. Thus, as shown in FIG. 1 for times $t_1$ and $t_2$, a negative going pulse (high-to-low-to-high) is produced at terminal 22 each time there is a transition of $E_i$ from one level to another. Each time $E_i$ makes a transition to a new level, the output C goes negative since flip flop 16 stores information corresponding to the previous level held by $E_i$ and gate T1 is disabled decoupling flip flop 16 from input node 12 until C goes negative. Since the information storage cell 16 does not change state until the output C goes from high-to-low then, perforce, C must first go from high-to-low before gate T1 is enabled. It is only then that gate T1 allows the new value of $E_i$ to be coupled to, and stored in, storage cell 16 and to then be applied to gate 20. The production of the negative going signal at C is therefore independent of the waveshape of $E_i$ or the gate delays making up the circuit. Following the negative transition at C, the output of gate 20 returns from the low-to-high condition disabling T1 when cell 16 stores the new value of the $E_i$. Because of the "self-clocking" feature of the circuit, the pulse at output 22 is guaranteed regardless of the input signal waveforms or the relative gate delays in the circuit. This pulse may be used as a timing pulse to trigger other circuits (not shown). However, the pulse width of the negative going pulse at output 20 is dependent on the delay through inverters I3 and I4, gate T1, storage cell 16 and gate 20. By selecting the impedances of the devices in these components the pulse width may be widened and narrowed. For example, the pulse width may be increased by making inverter I3 a skewed inverter with a high impedance P device to delay propagation of the logic 0 appearing at node C.

In FIG. 1 a negative going pulse is produced at output 22 for each transition of the input signal. But, it should be evident that, instead, a positive going pulse could be produced for each transition of $E_i$ by inverting A and $\overline{A}$, or by coupling an inverter to the output of gate 20. This would also enable the elimination of inverter I3.

The signal C at output 20 may be poorly defined if transient or noise signals are present at terminal 3 and hence node 12 when gate T1 is enabled.

The circuit of FIG. 3 which is designed to eliminate this possible problem includes an input circuit 40 which latches when there is a change in the level of the input signal. Circuit 40 then prevents further transitions of the input signal from being coupled to the transition detector 5 until an output pulse has been produced at output 22 in response to the level change of the input signal. The circuit 40 includes transmission gates T3 and T4, inverters I5, I6, I7 and a two-input NAND gate 8. The conduction path of transmission gate T3 is connected between the input terminal 3 and a node 41 to which is connected the input of inverter I5 and one end of the conduction path of gate T4. The other end of the conduction path of gate T4 is connected to the output of inverter I6. The output of inverter I5 and the input of inverter I6 are connected in common to node 12 which is the input of the transition detector 5. The gate electrode of transistors N4 and P3 and the input of inverter I7 are connected to the output of gate 8. The gate electrodes of transistors N3 and P4 are connected to the output of inverter I7. The input 81 of gate 8 is connected to the output 22 of comparator gate 20.

Detection circuit 5 is similar to the circuit of FIG. 1 except for the addition of transmission gate T2 between the output of inverter I2 and the input of inverter I1. Gate T2 is turned on when gate T1 is turned off.

The operation of the circuit may be more easily described by going through a typical operation cycle. Assume, initially, that $E_i$ applied to terminal 3 is high, that B at node 12 is low, that A is also low, and hence, that the output C of XNOR circuit 20 is high. With C high, E3 is low and E4 is high causing gate T2 to be turned on and gate T1 to be turned off. With C high, and assuming the Detector Enable signal applied to input 82 of gate 8 to be high, the output (E8) of NAND gate 8 is low and the output (E7) of inverter I7 is high causing gate T3 to be turned on and gate T4 to be turned off.

When gate T3 is enabled, $E_i$ at terminal 3 is coupled through the conduction path of gate T3 to the input of inverter I5 which produces a signal $\overline{E_i}$ at its output which is applied to node 12. In the circuit of FIG. 3, $\overline{E_i}$ is defined as B. When $E_i$ changes from high-to-low B goes from low-to-high. Since gate T1 is turned off the signal A remains low and $\overline{A}$ remains high. Since A is low and B is high the output C goes low.

To ensure the lock out of jitter and noise present at terminal 3, gate 8 and inverter I7 are designed to propagate the high-to-low transition of the C signal rapidly and the low-to-high transition of C slowly. On the other hand, inverters I3 and I4 are designed to propagate the high-to-low transition of C more slowly than gate 8 and I7 and to propagate the low-to-high transition of C more rapidly that gate 8 and I7. This may be achieved by selecting the ratio of the impedance of the devices in the outside loop (gate 8, inverter I7) and the inside loop (inverters I3 and I4).

As soon as C goes low, E8 goes from low-to-high turning off gate T3 and turning on gate T4. With gate T3 turned off, input terminal 3 is decoupled from node 41 which is the input to inverter I5. Gate T4 which is now turned on provides a conduction path between the output of inverter I6 and the input of inverter I5. This cross-couples inverters I5 and I6 forming a latch or flip flop 46. The latch 46 comprised of inverters I5, I6 and gate T4 stores the data bit (in this instance B equal to one) which caused the output C to go low. Circuit 40 is now in a stable state and will stay in that state so long as C remains low.

Concurrently with the above, (but more slowly), when C goes low, E3 goes high and E4 goes low causing gate T2 to be turned off and gate T1 to be turned on. The information at node 12 can now pass via the conduction path of transmission gate T1 to node 14 defined as the A input. The A and B inputs to EXCLUSIVE NOR 20 are now both high and the output C returns to the high level. C being high, causes E3 to go low and E4 to go high turning off gate T1 and turning on gate T2. With gate T2 turned on, the output of inverter I2 is connected to the input of inverter I1 and the two inverters are cross-coupled forming a latch or flip-flop 16a which stores A equal to one and $\overline{A}$ equal to zero.

Assuming the Decoder Enable to still be high, the return of C to the high level causes E8 to go low which turns on gate T3 and turns off gate T4. Turning off gate T4 removes the cross-coupling between inverters I5 and I6 and again allows input information to be coupled via gate T3 and inverter I5 to node 12.

In brief, when there is a change in $E_i$, flip flop 46 latches and stores the new level and locks out any further changes in $E_i$. The new level at node 12 causes the output C of the comparator to change state since flip flop 16a is still storing the information corresponding to the previous level of $E_i$. As soon as C changes state gate T1 is enabled and the new level is coupled to and applied to flip flop 16a which then stores the new information and the output C returns to its initial condition. The circuit of FIG. 3 like that of FIG. 1 does not require any external clocking signal to produce an output pulse (C). This "self-clocking" feature is of significance since it contributes to the simplicity of the circuit.

The circuit of FIG. 3 in addition to sensing changes in the data at node 12 suppresses noise spikes and transients appearing at the input 3.

It should be obvious that the circuit may be used to detect transitions of any signal regardless of its originating source. Furthermore, the circuit may be used as a digital filter locking out noise spikes associated with a signal transition while correctly detecting the transition.

What is claimed is:

1. The combination comprising:
    an input terminal;
    means for applying an input signal to said input terminal whose transitions are to be detected;
    comparing means having at least two inputs and one output and of the type which produces at its output a first binary value when the signals applied at its inputs have the same binary value and which produces a signal at its output having a second binary value when the signals applied at its inputs have different binary values;
    sampling means having an input and an output;
    means for coupling said input terminal to the input of said sampling means and to one of the inputs of said comparing means;
    bistable storage means for statically storing binary data connected to the output of said sampling means for receiving and storing sampled signals and connected to another one of said at least two inputs of said comparing means for applying thereto its stored signal; and means connected between the output of said comparing means and said sampling means for enabling said sampling means when the signal at the output of said comparing means is at one of said first and second binary values and for disabling said sampling means when the signal at the output of said comparing means is at the other one of said first and second binary values.

2. The combination as claimed in claim 1 wherein said sampling means is a transmission gate having a conduction path and a control electrode, and conduction path of said transmission gate being connected between said input terminal and the input to said bistable storage means.

3. The combination as claimed in claim 2 wherein said means connected between the output of said comparing means and said sampling means includes an inverter having an input and an output, the input of said inverter being connected to the output of said comparing means and the output of said inverter being connected to the control electrode of said transmission gate.

4. The combination as claimed in claim 3 wherein said bistable storage means includes two inverters, and means for cross coupling the two inverters for forming a flip flop; and wherein one of the outputs of the two inverters of the flip flop is connected to said another one of said at least two inputs of said comparing means.

5. The combination as claimed in claim 4 wherein said comparing means in an EXCLUSIVE NOR gate.

6. The combination as claimed in claim 1 wherein said means for applying an input signal to said input terminal includes:
   a. an input point adapted to receive input signals to be detected;
   b. selectively enabled transmission means connected between said input point and said input terminal for coupling a signal between said input point and said input terminal when enabled;
   c. a storage device connected to said input terminal for selectively storing a signal coupled to said input terminal by said transmission means and for applying the stored signal to said input terminal; and
   d. means connected between the output of said comparing means and said transmission means and storage device for enabling said transmission means and disabling said storage device in response to the output of said comparing means being at said other one of said first and second binary value and for disabling said transmission means and enabling said storage device in response to the output of said comparing means being at said one of said first and second binary values.

7. The combination as claimed in claim 6 wherein said means for disabling said transmission means and enabling said storage device responds more quickly to the output of said comparing means than said means for enabling said sampling means.

8. The combination as claimed in claim 7 wherein said sampling means includes a first transmission gate; wherein said transmission means includes a second transmission gate; wherein said means for enabling and disabling said sampling means includes an inside loop inverting means having an input connected to the output of said comparing means and an output connected to said first transmission gate for turning it on or off; and wherein said means for enabling and disabling said transmission means includes an outside loop inverting means having an input connected to the output of said comparing means and an output connected to said second transmission gate for turning it on or off.

9. The combination as claimed in claim 6 wherein said transmission means and said storage device include first and second transmission gates and first and second inverters; each inverter having an input and an output; wherein said first transmission gate has an input connected to said signal input point and an output connected to the input of said first inverter; wherein the output of said first inverter is connected to said input terminal; and means including said second transmission gate for enabling the cross-coupling of said first and second inverters when said second transmission gate is enabled and for disabling the cross-coupling of said first and second inverters when said second transmission gate is disabled.

* * * * *